United States Patent
Kraus et al.

(10) Patent No.: US 11,721,532 B2
(45) Date of Patent: *Aug. 8, 2023

(54) MODULAR MICROWAVE SOURCE WITH LOCAL LORENTZ FORCE

(71) Applicant: Applied Materials, Inc., Santa Clara, CA (US)

(72) Inventors: Philip Allan Kraus, San Jose, CA (US); Thai Cheng Chua, Cupertino, CA (US); Mani Subramani, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/338,510

(22) Filed: Jun. 3, 2021

(65) Prior Publication Data

US 2021/0287882 A1 Sep. 16, 2021

Related U.S. Application Data

(63) Continuation of application No. 15/588,597, filed on May 6, 2017, now Pat. No. 11,037,764.

(51) Int. Cl.
*H01J 37/32* (2006.01)
*H01J 27/18* (2006.01)
(Continued)

(52) U.S. Cl.
CPC ...... *H01J 37/32678* (2013.01); *C23C 14/357* (2013.01); *C23C 16/511* (2013.01);
(Continued)

(58) Field of Classification Search
CPC ............. H01J 37/32192; H01J 37/3222; H01J 37/32678; H01J 37/32238;
(Continued)

(56) References Cited

U.S. PATENT DOCUMENTS 5,053,678 A 10/1991 Koike et al.
5,081,398 A 1/1992 Asmussen et al.
(Continued)

FOREIGN PATENT DOCUMENTS

CN 1545722 11/2004
CN 101385129 3/2009
(Continued)

OTHER PUBLICATIONS

Notice of Reasons for Rejection from Japanese Patent Application No. 2019-560655 dated Jun. 7, 2021, 4 pgs.
(Continued)

*Primary Examiner* — Matthew J Song
(74) *Attorney, Agent, or Firm* — Schwabe, Williamson & Wyatt, P.C.

(57) ABSTRACT

Embodiments include methods and apparatuses that include a plasma processing tool that includes a plurality of magnets. In one embodiment, a plasma processing tool may comprise a processing chamber and a plurality of modular microwave sources coupled to the processing chamber. In an embodiment, the plurality of modular microwave sources includes an array of applicators positioned over a dielectric plate that forms a portion of an outer wall of the processing chamber, and an array of microwave amplification modules. In an embodiment, each microwave amplification module is coupled to one or more of the applicators in the array of applicators. In an embodiment, the plasma processing tool may include a plurality of magnets. In an embodiment, the magnets are positioned around one or more of the applicators.

10 Claims, 12 Drawing Sheets

(51) Int. Cl.
*H05H 1/46* (2006.01)
*C23C 16/511* (2006.01)
*C23C 14/35* (2006.01)

(52) U.S. Cl.
CPC .......... *H01J 27/18* (2013.01); *H01J 37/3222* (2013.01); *H01J 37/32192* (2013.01); *H01J 37/32201* (2013.01); *H01J 37/32238* (2013.01); *H01J 37/32247* (2013.01); *H01J 37/32266* (2013.01); *H01J 37/32669* (2013.01); *H01J 37/32935* (2013.01); *H05H 1/46* (2013.01)

(58) Field of Classification Search
CPC ........... H01J 37/32201; H01J 37/32247; H01J 27/18; H01J 37/3266; H05H 1/46; H05H 2001/463; C23C 16/511; C23C 14/357
See application file for complete search history.

(56) References Cited

U.S. PATENT DOCUMENTS

| | | | |
|---|---|---|---|
| 5,134,965 | A | 8/1992 | Tokuda et al. |
| 5,179,264 | A | 1/1993 | Cuomo et al. |
| 5,180,436 | A | 1/1993 | Ueda et al. |
| 5,198,725 | A * | 3/1993 | Chen ................. H01J 37/32192 315/111.41 |
| 5,304,277 | A | 4/1994 | Ohara et al. |
| 5,324,553 | A | 6/1994 | Ovshinsky et al. |
| 5,961,871 | A | 10/1999 | Bible et al. |
| 6,109,208 | A | 8/2000 | Tsuchihashi et al. |
| 6,158,383 | A | 12/2000 | Watanabe et al. |
| 6,204,603 | B1 | 3/2001 | Spitzi et al. |
| 6,263,830 | B1 | 7/2001 | Kamarehi et al. |
| 6,358,361 | B1 | 3/2002 | Matsumoto |
| 6,682,630 | B1 | 1/2004 | Colpo et al. |
| 6,741,944 | B1 | 5/2004 | Verdeyen et al. |
| 6,748,959 | B1 | 6/2004 | Kashiwaya et al. |
| 8,308,898 | B2 | 11/2012 | Kasai et al. |
| 9,245,741 | B2 | 1/2016 | Karakawa |
| 9,281,154 | B2 | 3/2016 | Ikeda et al. |
| 9,478,410 | B2 | 10/2016 | Kamada et al. |
| 11,037,764 | B2 * | 6/2021 | Kraus ....................... H05H 1/46 |
| 2003/0178143 | A1 | 9/2003 | Perrin |
| 2004/0007983 | A1 | 1/2004 | Sirkis et al. |
| 2004/0011465 | A1 | 1/2004 | Matsumoto et al. |
| 2005/0173069 | A1 | 8/2005 | Tolmachev et al. |
| 2006/0081624 | A1 | 4/2006 | Takada et al. |
| 2006/0137613 | A1* | 6/2006 | Kasai .................. H01J 37/3222 118/723 ME |
| 2009/0194508 | A1 | 8/2009 | Ui et al. |
| 2010/0074807 | A1 | 3/2010 | Bulkin et al. |
| 2011/0061814 | A1 | 3/2011 | Ikeda |
| 2011/0174778 | A1 | 7/2011 | Sawada et al. |
| 2011/0195201 | A1 | 8/2011 | Zhu et al. |
| 2011/0215722 | A1 | 9/2011 | Pelletier et al. |
| 2012/0247676 | A1* | 10/2012 | Fujino ................ H01J 37/32211 118/723 MW |
| 2013/0284370 | A1 | 10/2013 | Collins et al. |
| 2014/0002196 | A1 | 1/2014 | Leek |
| 2014/0197761 | A1* | 7/2014 | Grandemenge ... H01J 37/32229 219/709 |
| 2014/0283780 | A1 | 9/2014 | Smith et al. |
| 2015/0007774 | A1 | 1/2015 | Iwasaki et al. |
| 2015/0144265 | A1 | 5/2015 | Fujino et al. |
| 2015/0173167 | A1* | 6/2015 | Lacoste ................. C23C 14/357 315/111.61 |
| 2015/0206778 | A1 | 7/2015 | Shimomura |
| 2015/0211124 | A1 | 7/2015 | Nozawa et al. |
| 2015/0232993 | A1 | 8/2015 | Iwao et al. |
| 2015/0279627 | A1 | 10/2015 | Iwasaki et al. |
| 2015/0371828 | A1 | 12/2015 | Stowell |
| 2016/0189950 | A1 | 6/2016 | Oyama et al. |
| 2016/0322218 | A1 | 11/2016 | Fukiage et al. |
| 2017/0032939 | A1 | 2/2017 | Choquet et al. |
| 2017/0133202 | A1 | 5/2017 | Berry, III |
| 2018/0127880 | A1 | 5/2018 | Kotani et al. |
| 2018/0218883 | A1 | 8/2018 | Iwao |
| 2018/0277339 | A1 | 9/2018 | Kaneko et al. |

FOREIGN PATENT DOCUMENTS

| | | |
|---|---|---|
| CN | 102737947 | 10/2012 |
| CN | 104770069 | 7/2015 |
| EP | 1589793 | 10/2005 |
| JP | H07-263188 | 10/1995 |
| JP | H07-320894 A | 12/1995 |
| JP | H08-203873 | 8/1996 |
| JP | H09-064018 | 3/1997 |
| JP | 2004-266268 A | 9/2004 |
| JP | 2010-525155 | 7/2010 |
| JP | 2012-216745 | 11/2012 |
| KR | 10-2012-0112253 | 10/2012 |
| KR | 10-2014-0038433 | 3/2014 |
| KR | 10-2016-0147798 | 12/2016 |
| TW | 2013/06080 | 2/2013 |
| WO | WO 2004/064460 | 5/2006 |
| WO | WO 2013/114870 | 8/2013 |
| WO | WO 2013/122043 | 8/2013 |
| WO | WO 2014/017132 | 1/2014 |
| WO | WO 2016/089424 | 6/2016 |

OTHER PUBLICATIONS

Chang, Xijiang, Doctorate Thesis, "Developments of surface-wave excited plasma sources using 915 MHZ ultra high frequency wave and 2.45 GHZ microwave." Shizuoka University, Jun. 2013.
International Search Report and Written Opinion from PCT/US2017/013984 dated May 1, 2017, 10 pgs.
International Search Report and Written Opinion from PCT/US2018/022044 dated Jun. 29, 2018, 11 pgs.
International Search Report and Written Opinion from PCT/US2018/026330 dated Jul. 26, 2018, 12 pgs.
Non-Final Office Action from U.S. Appl. No. 15/238,695 dated Jan. 25, 2019, 30 pgs.
International Preliminary Report on Patentability from PCT/US2017/013984 dated Feb. 19, 2019, 15 pgs.
Non-Final Office Action from U.S. Appl. No. 15/485,217 dated May 15, 2019, 23 pgs.
Non-Final Office Action from U.S. Appl. No. 15/238,695 dated Jul. 5, 2019, 25 pgs.
Non-Final Office Action from U.S. Appl. No. 15/588,597 dated Oct. 15, 2019 14 pgs.
International Preliminary Report on Patentability from PCT/US2018/022044 dated Oct. 24, 2019, 8 pgs.
Final Office Action from U.S. Appl. No. 15/485,217 dated Oct. 30, 2019, 20 pgs.
International Preliminary Report on Patentability from PCT/US2018/026330 dated Nov. 21, 2019, 9 pgs.
Final Office Action from U.S. Appl. No. 15/588,597 dated May 12, 2020 15 pgs.
Non-Final Office Action from U.S. Appl. No. 15/588,597 dated Oct. 1, 2020 15 pgs.
Notice of Preliminary Rejection from Korean Patent Application No. 10-2019-7036166 dated Oct. 12, 2020, 11 pgs.
Notice of Reasons for Rejection from Japanese Patent Application No. 2019-560655 dated Dec. 4, 2020, 8 pgs.
Official Letter from Taiwan Patent Application No. 107114775 dated Jan. 12, 2021, 9 pgs.
Notice of Final Rejection from Korean Patent Application No. 10-2019-7036166 dated Feb. 17, 2021, 4 pgs.
Notice of Last Preliminary Rejection from Korean Patent Application No. 10-2019-7036166 dated Mar. 16, 2021, 7 pgs.
Notice of First Office Action from Chinese Patent Application No. 201880029380.8 dated Jul. 6, 2021, 12 pgs.
Notice of Reasons for Rejection from Japanese Patent Application No. 2021-206782 dated Nov. 17, 2022, 7 pgs.

* cited by examiner

MODULAR MICROWAVE SOURCE WITH LOCAL LORENTZ FORCE

CROSS-REFERENCE TO RELATED APPLICATIONS

This application is a continuation of U.S. patent application Ser. No. 15/588,597, filed on May 6, 2017, now U.S. Pat. No. 11,037,764, issued on Jun. 15, 2021, the entire contents of which are hereby incorporated by reference herein.

BACKGROUND

1) Field

Embodiments relate to the field of microwave plasma sources and, in particular, to modular microwave plasma sources with magnets.

2) Description of Related Art

Plasma processing is used extensively in the manufacture of many different technologies, such as those in the semiconductor industry, display technologies, microelectromechanical systems (MEMS), and the like. Currently, radio frequency (RF) generated plasmas are most often used. Plasmas generated with a microwave source allow for denser plasmas and/or plasmas with a high concentration of excited neutral species. Unfortunately, plasmas generated with a microwave source also suffer drawbacks. Typical microwave plasma systems use a singular, large source of microwave radiation (typically a magnetron), and a transmission path for guiding the microwave radiation from the magnetron to the processing chamber. For typical high power applications, the transmission path is a microwave waveguide. Waveguides are used because outside of a waveguide designed to carry the specific frequency of the microwave source, the microwave power attenuates rapidly. Additional components, such as tuners, couplers, mode transformers, and the like are also required to transmit the microwave radiation to the processing chamber. These components limit the construction to large systems, and severely limit the design. Further, the geometry of the plasma is constrained since the geometry of the plasma resembles the shape of the waveguides.

Accordingly, it is difficult to match the geometry of the plasma to the geometry of the substrate that is being processed. In particular, it is difficult to create a microwave plasma where the plasma is generated over the entire surface of the wafer of larger substrates (e.g., 300 mm or greater wafers). Some microwave generated plasmas may use a slot line antenna to allow the microwave energy to be spread over an extended surface. However, such systems are complicated, require specific geometry, and are limited in the power density that is coupled to the plasma.

Furthermore, microwave plasma discharges are typically not stable at low pressure (e.g., less than approximately 0.5 Torr). The microwave plasma is not stable due to a combination of the short electron trajectory produced by the high frequency of the microwave excitation and the small number of background gas molecules because of the low pressure. The combination of these effects results in a low frequency of ionizing collisions. One option for increasing the probability of ionizing collisions is to lengthen the electron trajectory by coupling a magnetic field to the plasma. Coupling of the magnetic field to the plasma lengthens the electron trajectory due to the Lorentz force. With a longer electron trajectory, the probability of an ionizing collision of an electron with the background gas increases. As such, the plasma is stabilized even when the system is operated at lower pressures.

However, practical problems occur when trying to implement a uniform magnetic field across a large area, such as the area over wafers (e.g., 300 mm or larger) used in many semiconductor manufacturing processes. For example, the size of a permanent magnet array or an electromagnet needed for large substrates increases the overall size of the processing tool and increases the complexity and expense of the processing tool. Additionally, when a large electromagnet is used, high currents are required in order to provide a magnetic field of the desired strength.

Furthermore, it is to be appreciated that a magnetic field may alter the processing of a wafer and/or damage existing structures on a wafer. Accordingly, the magnetic field strength near the plasma source needs to be sufficiently high to stabilize the plasma, while at the same time having a negligible magnetic field strength (e.g., 1 G or less) at the plane of the wafer. However, increasing the magnetic field strength near the plasma source results in an undesirable increase of the magnetic field strength proximate to the wafer as well. Accordingly, it is difficult to scale a microwave plasma system with a coupled magnetic field to very large substrate sizes, such as 300 mm wafers, or substrates that are the size of glass panels used in the display industry. Additionally, microwave sources typically generate plasmas that are not highly uniform and/or are not able to have a spatially tunable density. Particularly, the uniformity of the plasma source is dependent on the modes of the standing wave pattern of the microwave with respect to the particular geometry of the microwave cavity or antenna. Thus, the uniformity of the design and is not tunable. As the substrates that are being processed continue to increase in size, it becomes increasingly difficult to account for edge effects due to the inability to tune the plasma. Additionally, the inability to tune the plasma limits the ability to modify processing recipes to account for incoming substrate non-uniformity and adjust the plasma density for processing systems in which a nonuniformity is required to compensate for the design of the processing system (e.g., to accommodate the nonuniform radial velocity of the rotating wafers in some processing chambers).

SUMMARY

Embodiments include methods and apparatuses that include a plasma processing tool that includes a plurality of magnets. In one embodiment, a plasma processing tool may comprise a processing chamber and a plurality of modular microwave sources coupled to the processing chamber. In an embodiment, the plurality of modular microwave sources includes an array of applicators positioned over a dielectric plate that forms a portion of an outer wall of the processing chamber, and an array of microwave amplification modules. In an embodiment, each microwave amplification module is coupled to one or more of the applicators in the array of applicators. In an embodiment, the plasma processing tool may include a plurality of magnets. In an embodiment, the magnets are positioned around one or more of the applicators.

An additional embodiment may include a modular microwave applicator. In an embodiment, the modular microwave applicator may include a dielectric resonant cavity, and an applicator housing formed around an outer sidewall of the dielectric resonant cavity. In an embodiment, the modular microwave applicator may also include a monopole extending down an axial center of the dielectric resonator and into a channel formed in the center of the dielectric resonant cavity. In an embodiment a magnet may be embedded within the applicator housing.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Figure 1:
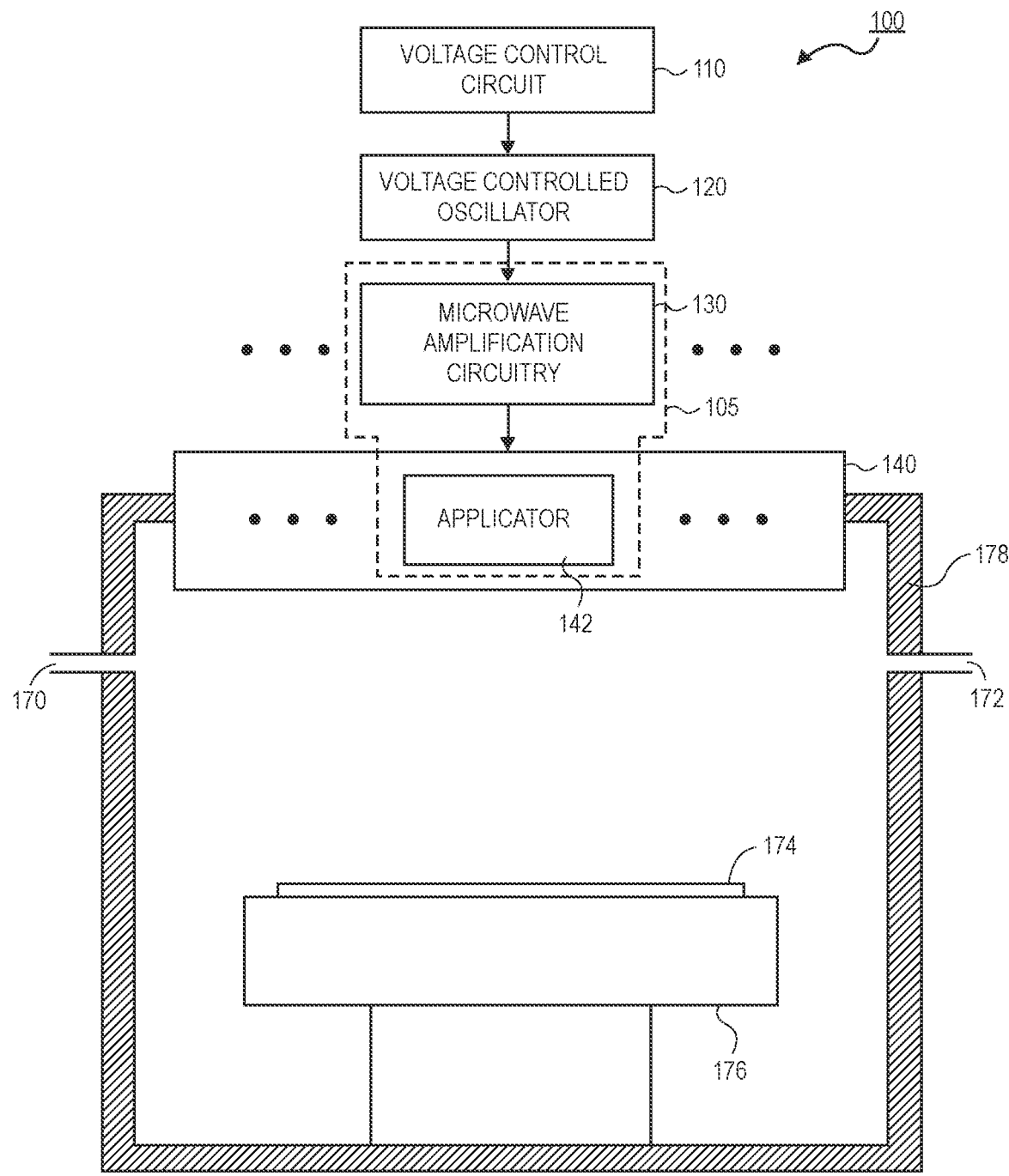
FIG. 1 is a schematic diagram of a plasma processing tool that includes a modular microwave plasma source, in accordance with an embodiment.

Devices that include one or more modular microwave plasma sources are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Embodiments include a microwave source that comprises one or more microwave modules. According to an embodiment, each microwave module comprises a microwave solid state electronics portion and an applicator portion. In an embodiment, the applicator portion may be a dielectric resonator.

The use of solid state electronics instead of a magnetron allows for a significant reduction in the size and the complexity of the plasma source. Particularly, the solid state components are much smaller than the magnetron hardware described above. Additionally, the use of solid state components allows for the elimination of bulky waveguides needed to transmit the microwave radiation to the processing chamber. Instead, the microwave radiation may be transmitted with coaxial cabling. The elimination of waveguides also allows for the construction of a large area microwave source where the size of the plasma formed is not limited by the size of waveguides. Instead, an array of microwave modules may be constructed in a given pattern that allows for the formation of a plasma that is arbitrarily large (and arbitrarily shaped) to match the shape of any substrate. Furthermore, the cross-sectional shape of the applicators may be chosen so that the array of applicators may be packed together as tightly as possible (i.e., a closed-packed array). Embodiments may also allow for applicators in the array of microwave modules to have non-uniform sizes. As such, the packing efficiency may be improved further.

The use of an array of microwave modules also provides greater flexibility in the ability to locally change the plasma density by independently changing the power settings of each microwave module. This allows for uniformity optimization during plasma processing, such as adjustments made for wafer edge effects, adjustments made for incoming wafer nonuniformity, and the ability to adjust the plasma density for processing systems in which a nonuniformity is needed to compensate for the design of the processing system (e.g., to accommodate the nonuniform radial velocity of the rotating wafers in some processing chambers).

Furthermore, embodiments allow for operation of a stable plasma at low pressures by coupling a magnetic field to each microwave module. Instead of a single large magnet used for the entire processing tool, such as described above, embodiments may include a plurality of magnets that may be coupled to each microwave module. Providing a plurality of localized magnets minimizes the spreading of the magnetic field. As such, the magnetic field may be constructed so that the magnitude is large near the microwave resonator while having a small magnitude proximate to a substrate being processed in the processing tool. For example, the magnetic field may be greater than approximately 10 G near the microwave resonator while being less than approximately 1 G near the plane of a substrate being processed. At a specific magnetic field strength, a plasma may experience electron cyclotron resonance (ECR) which results in dense plasmas. The magnetic field strength needed to generate ECR is dependent on the excitation frequency. For example, at a 2.45 GHz excitation frequency, ECR may occur when the magnetic field strength is 875 G. Accordingly, the use of localized magnets allows for magnetic field strengths of such magnitude near the plasma without generating high magnetic field strengths near a substrate.

The localized nature of the magnetic field to each microwave resonator also allows for the magnetic field to be oriented perpendicular to the main component of the electron velocity vector. Orienting the magnetic field substantially perpendicular to the electron velocity vector allows for the Lorentz force to be maximized. As such, the efficiency of the module may be improved over the use of a single larger magnetic source, such as those described above.

Additional embodiments may also include one or more plasma monitoring sensors. Such embodiments provide a way to measure the density of the plasma (or any other plasma property) locally by each applicator, and to use that measurement as part of a feedback loop to control the power applied to each microwave module. Accordingly, each microwave module may have independent feedback, or a subset of the microwave modules in the array may be grouped in zones of control where the feedback loop controls the subset of microwave modules in the zone.

Referring now to FIG. 1, a cross-sectional illustration of a processing tool 100 is shown, according to an embodiment. The processing tool 100 may be a processing tool suitable for any type of processing operation that utilizes a plasma. For example, the plasma processing tool 100 may be a processing tool used for plasma enhanced chemical vapor deposition (PECVD), plasma enhanced atomic layer deposition (PEALD), etch and selective removal, and plasma cleaning. While the embodiments described in detail herein are directed to plasma processing tools, it is to be appreciated that additional embodiments may include a processing tool 100 that include any tool that utilizes microwave radiation. For example, a processing tool 100 that utilizes microwave radiation without needing the formation of a plasma may include industrial heating and/or curing processing tools 100.

Generally, embodiments include a processing tool 100 that includes a chamber 178. In processing tools 178 that are used for plasma processing, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. While not shown, it is to be appreciated that the processing tool may include a showerhead for evenly distributing the processing gases over a substrate 174.

In an embodiment, the substrate 174 may be supported on a chuck 176. For example, the chuck 176 may be any suitable chuck, such as an electrostatic chuck. The chuck may also include cooling lines and/or a heater to provide temperature control to the substrate 174 during processing.

Due to the modular configuration of the microwave modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to an embodiment, the processing tool 100 includes one or more modular microwave sources 105. The modular microwave source 105 may include solid state microwave amplification circuitry 130 and an applicator 142. In an embodiment, a voltage control circuit 110 provides an input voltage to a voltage controlled oscillator 120 in order to produce microwave radiation at a desired frequency that is transmitted to the solid state microwave amplification circuitry 130 in each modular microwave source 105. After processing by the microwave amplification circuitry 130, the microwave radiation is transmitted to the applicator 142. According to an embodiment, an array 140 of applicators 142 are coupled to the chamber 178 and each function as an antenna for coupling the microwave radiation to the processing gasses in the chamber 178 to produce a plasma.

Figure 2:
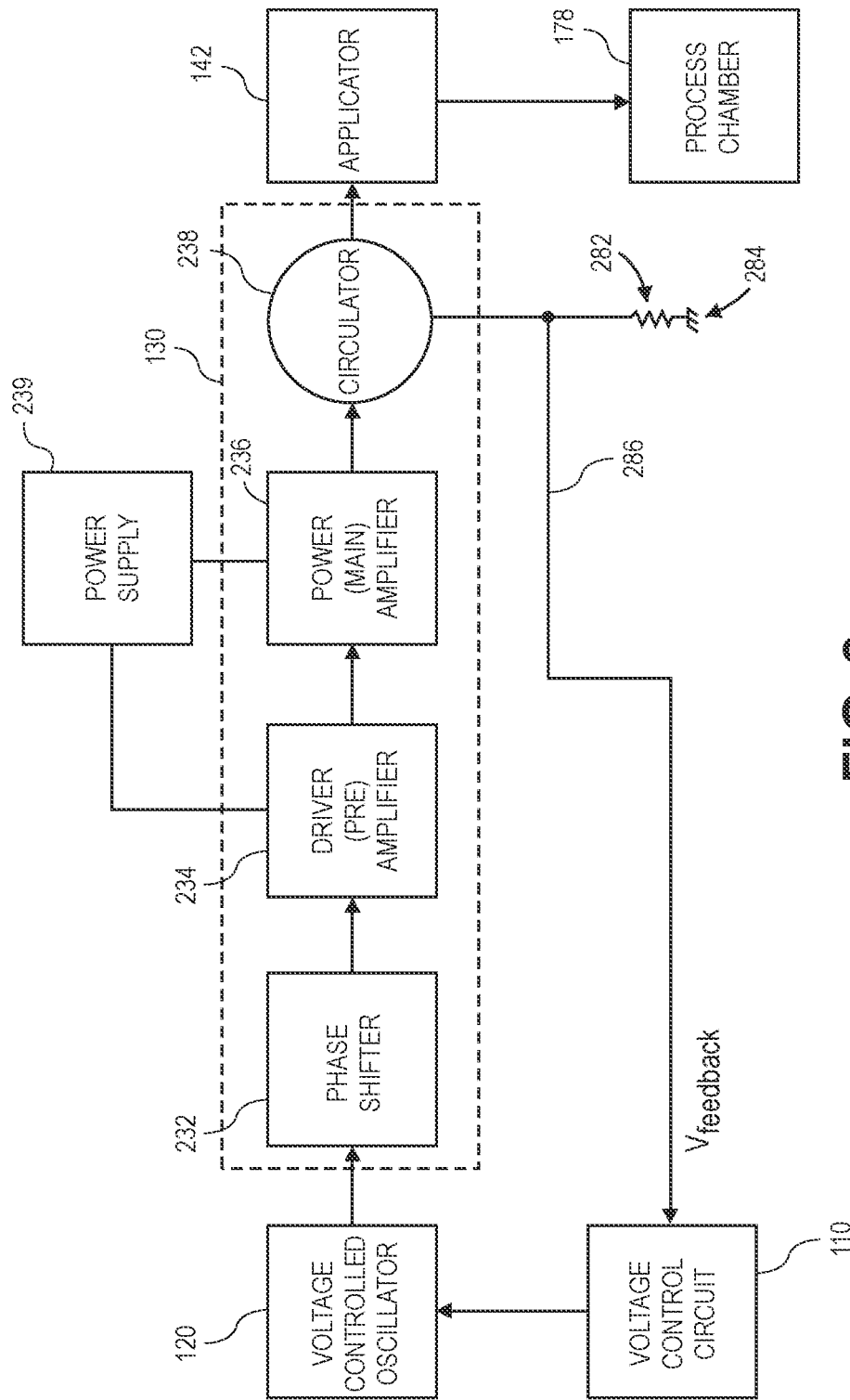
FIG. 2 is a schematic block diagram of a solid state microwave plasma source, in accordance with an embodiment.

Referring now to FIG. 2, a schematic block diagram of the electronics in a modular microwave source is shown and described in greater detail, according to an embodiment. As described above, a voltage control circuit 110 provides an input voltage to a voltage controlled oscillator 120. Embodiments may include an input voltage between approximately 1V and 10V DC. The voltage controlled oscillator 120 is an electronic oscillator whose oscillation frequency is controlled by the input voltage. According to an embodiment, the input voltage from the voltage control circuit 110 results in the voltage controlled oscillator 120 oscillating at a desired frequency. In an embodiment, the microwave radiation may have a frequency between approximately 2.3 GHz and 2.6 GHz.

According to an embodiment, the microwave radiation is transmitted from the voltage controlled oscillator 120 to the microwave amplification circuitry 130. In the illustrated embodiment, a single instance of the microwave amplification circuitry 130 is shown. However, embodiments may include any number of instances of microwave amplification circuitry 130. Particularly, the number of instances of microwave amplification circuitry 130 may be equal to the number of applicators 142 needed in the array 140 of applicators 142. As such, each applicator 142 may be coupled to different instances of the microwave amplification circuitry 130 to provide individual control of the power supplied to each applicator 142. According to an embodiment, when more than one modular microwave source 105 is used in the process tool 100, the microwave amplification circuitry 130 may include a phase shifter 232. When only a single applicator is used, the phase shifter 232 may be omitted. The microwave amplification circuitry 130 may also include a driver/pre-amplifier 234, and a main microwave power amplifier 236 that are each coupled to a power supply 239. According to an embodiment, the microwave amplification circuitry 130 may operate in a pulse mode. For example, the microwave amplification circuitry 130 may have a duty cycle between 1% and 99%. In a more particular embodiment, the microwave amplification circuitry 130 may have a duty cycle between approximately 15% and 30%.

In an embodiment, the microwave radiation may be transmitted to the applicator 142 after being amplified.

However, part of the power transmitted to the applicator 142 may be reflected back due to the mismatch in the output impedance. Accordingly, some embodiments also include a feedback line 286 that allows for the level of reflected power to be fed back to the voltage control circuit 110. The level of reflected power $V_{feedback}$ may be directed to the feedback line 286 by using a circulator 238 between the power amplifier 236 and the applicator 142. The circulator 238 directs the reflected power to a dummy load 282 and ground 284, with the level of reflected power $V_{feedback}$ being read prior to the dummy load 282. In an embodiment, the level of reflected power $V_{feedback}$ may be used by the voltage control circuit 110 to adjust the output voltage that is sent to the voltage controlled oscillator 120, which in turn varies the output frequency of the microwave radiation that is transmitted to the microwave amplification circuitry 130. The presence of such a feedback loop allows for embodiments to provide continuous control of the input voltage of the voltage controlled oscillator 120, and allows for reductions in the level of reflected power $V_{feedback}$. In an embodiment, the feedback control of the voltage controlled oscillator 120 may allow for the level of the reflected power to be less than approximately 5% of the forward power. In some embodiments, the feedback control of the voltage controlled oscillator 120 may allow for the level of the reflected power to be less than approximately 2% of the forward power. Accordingly, embodiments allow for an increased percentage of the forward power to be coupled into the processing chamber 178, and increases the available power density coupled to the plasma. Furthermore, impedance tuning using a feedback line 286 is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 120.

Figure 3A:
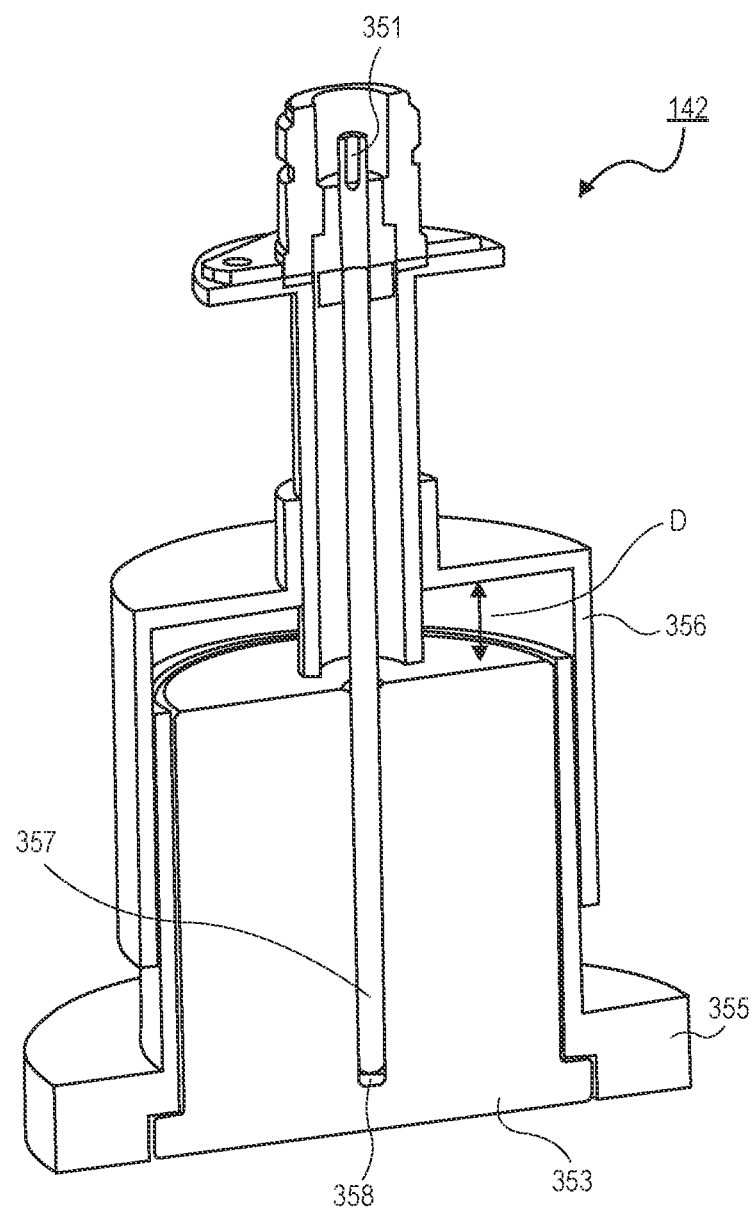
FIG. 3A is cross-sectional illustration of an applicator that may be used to couple microwave radiation to a processing chamber, in accordance with an embodiment.

Referring now to FIG. 3A, a cut-away illustration of an applicator 142 is shown, according to an embodiment. In an embodiment, the microwave radiation is transmitted to an applicator 142 by a coaxial cable 351 that couples to a monopole 357 that extends axially through the applicator 142. The monopole 357 may also extend into a channel 358 formed into a center of a dielectric resonant cavity 353. The dielectric resonant cavity 353 may be a dielectric material, such as quartz, aluminum oxide, titanium oxide, or the like. Additional embodiments may also include a resonant cavity 353 that does not include a material (i.e., the dielectric resonant cavity 353 may be air or a vacuum). According to an embodiment, the dielectric resonator is dimensioned so that the dielectric resonator supports resonance of the microwave radiation. Generally, the size of the dielectric resonant cavity 353 is dependent on the dielectric constant of the material used to form the dielectric resonant cavity 353 and the frequency of the microwave radiation. For example, materials with higher dielectric constants would allow for smaller resonant cavities 353 to be formed. In an embodiment where the dielectric resonant cavity 353 includes a circular cross-section, the diameter of the dielectric resonant cavity 353 may be between approximately 1 cm and 15 cm. In an embodiment, the cross-section of the dielectric resonant cavity 353 along a plane perpendicular to the monopole 357 may be any shape, so long as the dielectric resonant cavity 353 is dimensioned to support resonance. In the illustrated embodiment, the cross-section along a plane perpendicular to the monopole 357 is circular, though other shapes may also be used, such as polygons (e.g., triangles, rectangles, etc.), symmetrical polygons (e.g., squares, pentagons, hexagons, etc.), ellipses, or the like.

In an embodiment, the cross-section of the dielectric resonant cavity 353 may not be the same at all planes perpendicular to the monopole 357. For example, the cross-section of a bottom extension proximate to the open end of the applicator housing 355 is wider than the cross-section of the dielectric resonant cavity proximate to the channel 358. In addition to having cross-sections of different dimensions, the dielectric resonant cavity 353 may have cross-sections with different shapes. For example, the portion of the dielectric resonant cavity 353 proximate to the channel 358 may have a circular shaped cross-section, whereas the portion of the dielectric resonant cavity 353 proximate to the open end of the applicator housing 355 may be a symmetrical polygon shape (e.g., pentagon, hexagon, etc.). However, it is to be appreciated that embodiments may also include a dielectric resonant cavity 353 that has a uniform cross-section at all planes perpendicular to the monopole 357.

According to an embodiment, the applicator 142 may also include an impedance tuning backshort 356. The backshort 356 may be a displaceable enclosure that slides over an outer surface of the applicator housing 355. When adjustments to the impedance need to be made, an actuator (not shown) may slide the backshort 356 along the outer surface of the applicator housing 355 to change a distance D between a surface of the backshort 356 and a top surface of the dielectric resonant cavity 353. As such, embodiments provide more than one way to adjust the impedance in the system. According to an embodiment, an impedance tuning backshort 356 may be used in conjunction with the feedback process described above to account for impedance mismatches. Alternatively, the feedback process or an impedance tuning backshort 356 may be used by themselves to adjust for impedance mismatches.

According to an embodiment, the applicator 142 functions as a dielectric antenna that directly couples the microwave electromagnetic field into the processing chamber 178. The particular axial arrangement of the monopole 357 entering the dielectric resonant cavity 353 may produce an TM01δ mode excitation. However different modes of excitation may be possible with different applicator arrangements. For example, while an axial arrangement is illustrated in FIG. 3A, it is to be appreciated that the monopole 357 may enter the dielectric resonant cavity 353 from other orientations. In one such embodiment, the monopole 357 may enter the dielectric resonant cavity 353 laterally, (i.e., through a sidewall of the dielectric resonant cavity 353).

Figure 3B:
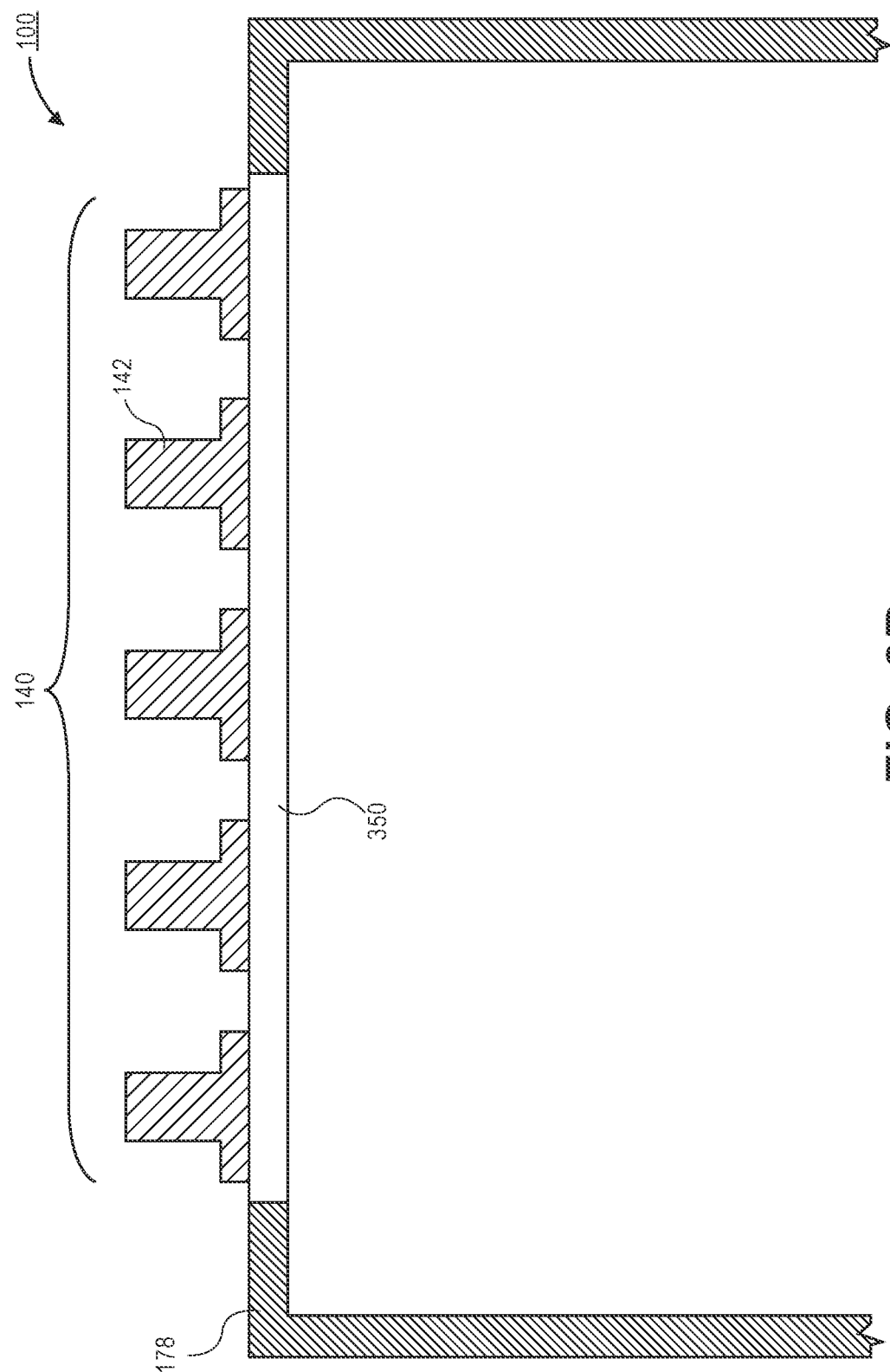
FIG. 3B is a cross-sectional illustration of an array of applicators positioned on a dielectric sheet that is part of the processing chamber, in accordance with an embodiment.

Referring now to FIG. 3B, an illustration of a portion of a processing tool 100 with an array 140 of applicators 142 coupled to the chamber 178 is shown, according to an embodiment. In the illustrated embodiment, the microwave radiation from the applicators 142 is coupled into the chamber 178 by being positioned proximate to a dielectric plate 350. The proximity of the applicators 142 to the dielectric plate 350 allows for the microwave radiation resonating in the dielectric resonant cavity 353 (not shown in FIG. 3B) to couple with the dielectric plate 350, which may then couple with processing gasses in the chamber to generate a plasma. In one embodiment, the dielectric resonant cavity 353 may be in direct contact with the dielectric plate 350. In an additional embodiment, the dielectric resonant cavity 353 may be spaced away from a surface of the dielectric plate 350, so long as the microwave radiation can still be transferred to the dielectric plate 350.

According to an embodiment, the array 140 of applicators 142 may be removable from the dielectric plate 350 (e.g., for maintenance, to rearrange the array of applicators to accommodate a substrate with different dimensions, or for any other reason) without needing to remove the dielectric plate 350 from the chamber 178. Accordingly, the applicators 142 may be removed from the processing tool 100 without needing to release a vacuum in the chamber 178. According to an additional embodiment, the dielectric plate 350 may also function as a gas injection plate or a showerhead.

Figure 4A:
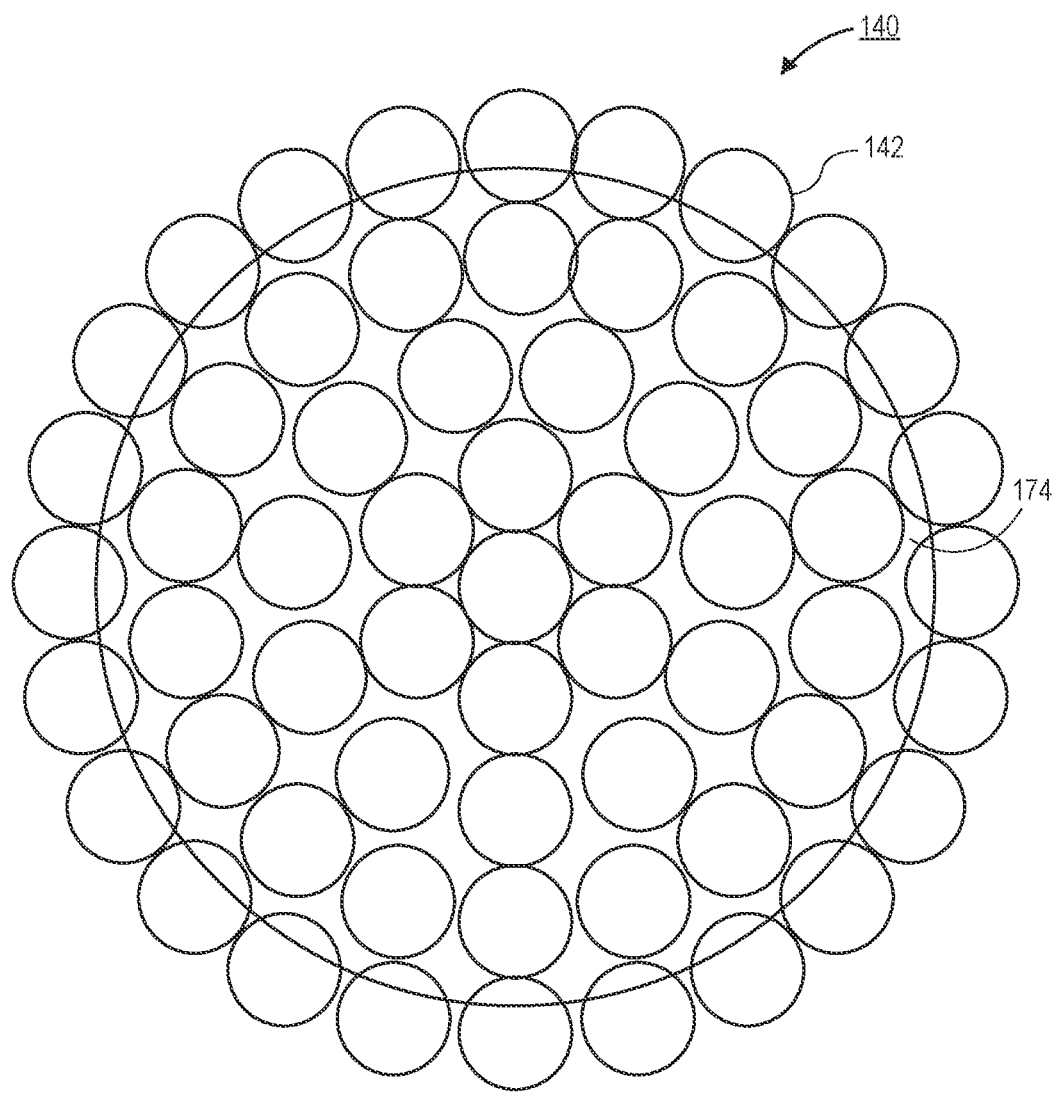
FIG. 4A is a plan view of an array of applicators that may be used to couple microwave radiation to a processing chamber, in accordance with an embodiment.

As noted above, an array of applicators 140 may be arranged so that they provide coverage of an arbitrarily shaped substrate 174. FIG. 4A is a plan view illustration of an array 140 of applicators 142 that are arranged in a pattern that matches a circular substrate 174. By forming a plurality of applicators 142 in a pattern that roughly matches the shape of the substrate 174, the plasma becomes tunable over the entire surface of the substrate 174. For example, each of the applicators 142 may be controlled so that a plasma with a uniform plasma density across the entire surface of the substrate 174 is formed. Alternatively, one or more of the applicators 142 may be independently controlled to provide plasma densities that are variable across the surface of the substrate 174. As such, incoming nonuniformity present on the substrate may be corrected. For example, the applicators 142 proximate to an outer perimeter of the substrate 174 may be controlled to have a different power density than applicators proximate to the center of the substrate 174.

In FIG. 4A, the applicators 142 in the array 140 are packed together in a series of concentric rings that extend out from the center of the substrate 174. However, embodiments are not limited to such configurations, and any suitable spacing and/or pattern may be used depending on the needs of the processing tool 100. Furthermore, embodiments allow for applicators 142 with any symmetrical cross-section, as described above. Accordingly, the cross-sectional shape chosen for the applicator may be chosen to provide enhanced packing efficiency.

Figure 4B:
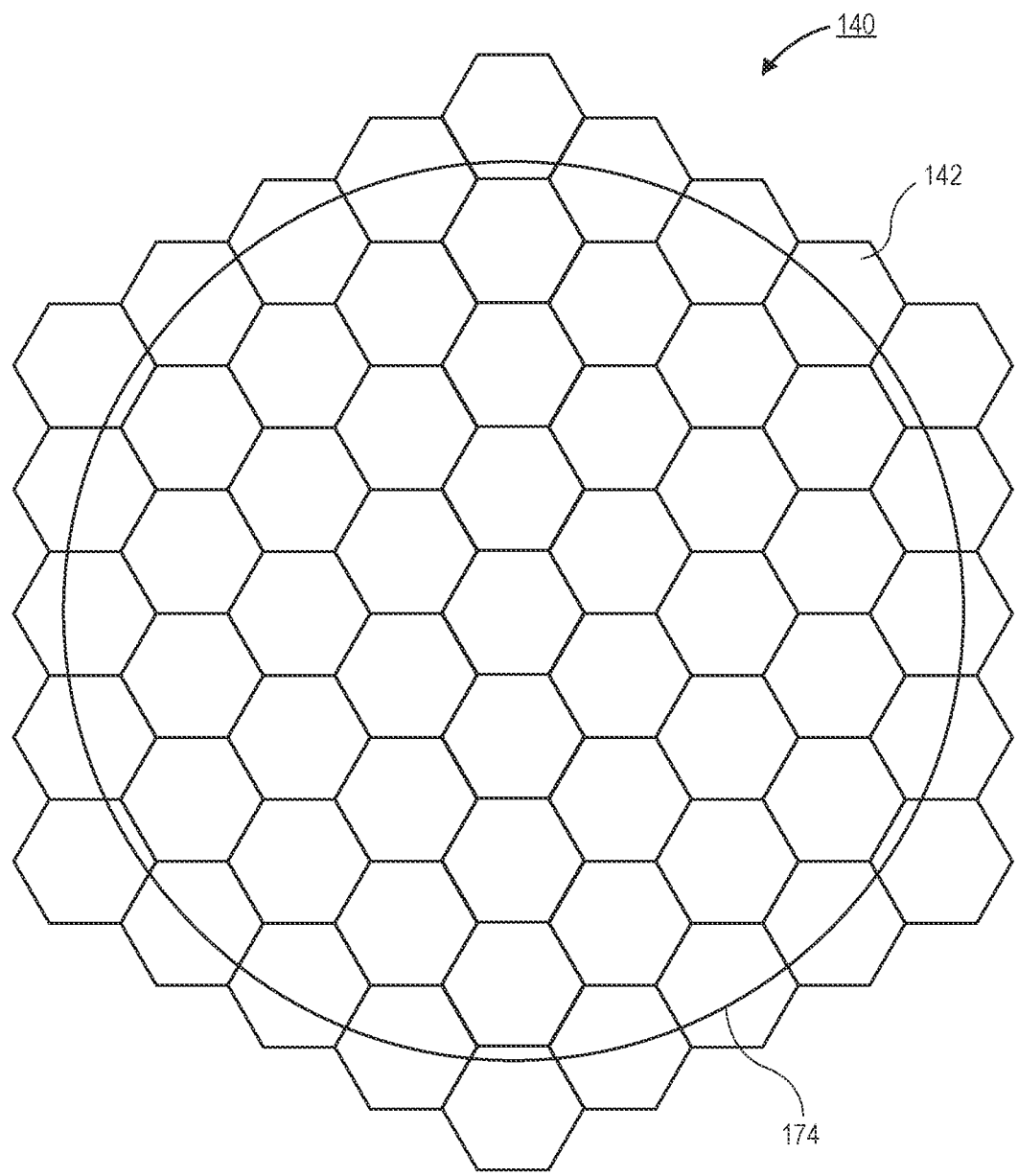
FIG. 4B is a plan view of an array of applicators that may be used to couple microwave radiation to a processing chamber, in accordance with an additional embodiment.

Referring now to FIG. 4B, a plan view of an array 140 of applicators 142 with a non-circular cross-section is shown, according to an embodiment. The illustrated embodiment includes applicators 142 that have hexagonal cross-sections. The use of such an applicator may allow for improved packing efficiency because the perimeter of each applicator 142 may mate nearly perfectly with neighboring applicators 142. Accordingly, the uniformity of the plasma may be enhanced even further since the spacing between each of the applicators 142 may be minimized. While FIG. 4B illustrates neighboring applicators 142 sharing sidewall surfaces, it is to be appreciated that embodiments may also include non-circular symmetrically shaped applicators that include spacing between neighboring applicators 142.

Figure 4C:
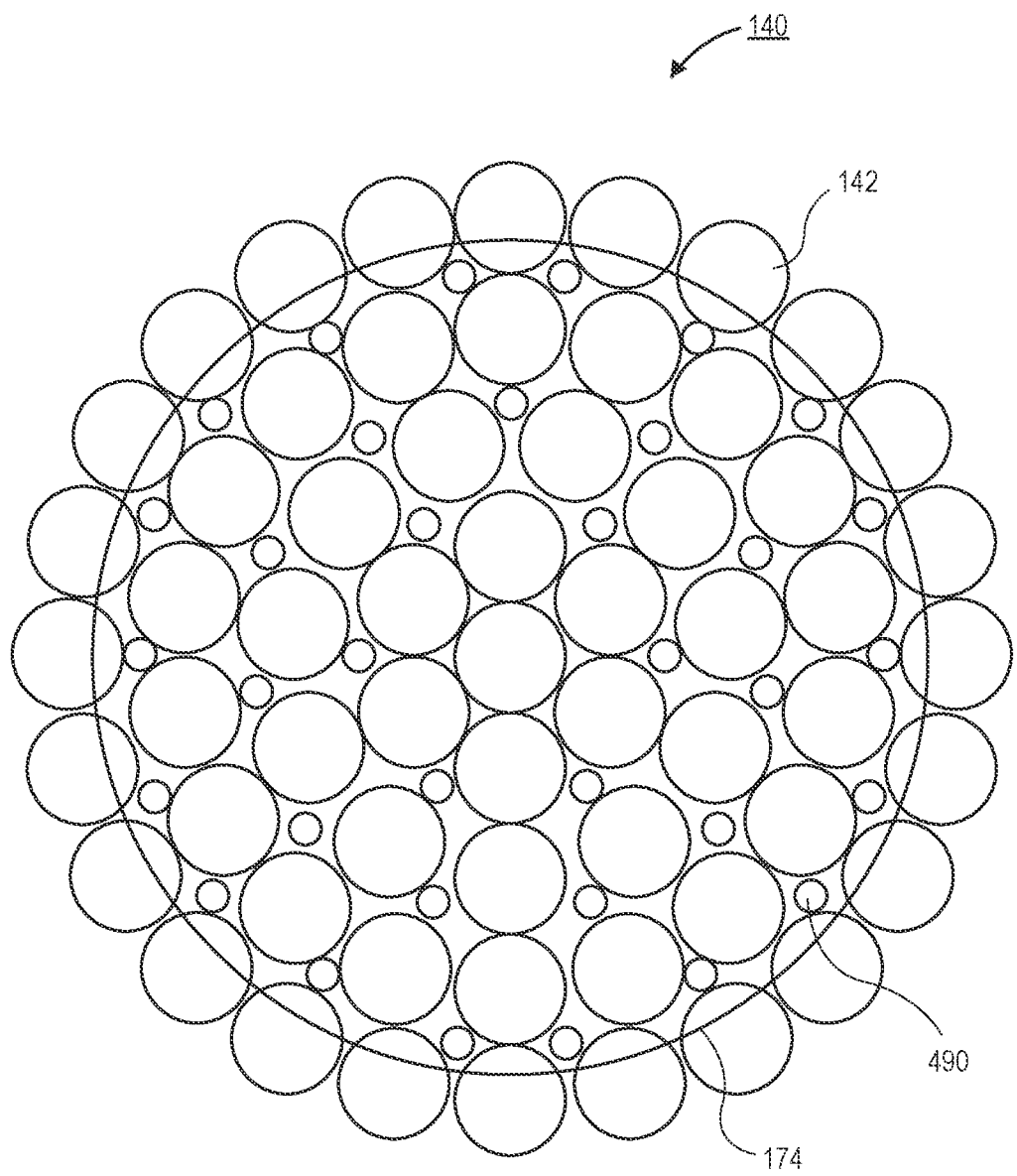
FIG. 4C is a plan view of an array of applicators and a plurality of sensors for detecting conditions of a plasma, in accordance with an embodiment.

Referring now to FIG. 4C, an additional plan-view illustration of an array 140 of applicators 142 is shown according to an embodiment. The array 140 in FIG. 4C is substantially similar to the array 140 described above with respect to FIG. 4A, except that a plurality of sensors 490 are also included. The plurality of sensors provides improved process monitoring capabilities that may be used to provide additional feedback control of each of the modular microwave sources 105. In an embodiment, the sensors 490 may include one or more different sensor types 490, such as plasma density sensors, plasma emission sensors, or the like. Positioning the sensors across the surface of the substrate 174 allows for the plasma properties at given locations of the processing chamber 100 to be monitored.

According to an embodiment, every applicator 142 may be paired with a different sensor 490. In such embodiments, the output from each sensor 490 may be used to provide feedback control for the respective applicator 142 to which the sensor 490 has been paired. Additional embodiments may include pairing each sensor 490 with a plurality of applicators 142. For example, each sensor 490 may provide feedback control for multiple applicators 142 to which the sensor 490 is proximately located. In yet another embodiment, feedback from the plurality of sensors 490 may be used as a part of a multi-input multi-output (MIMO) control system. In such an embodiment, each applicator 142 may be adjusted based on feedback from multiple sensors 490. For example, a first sensor 490 that is a direct neighbor to a first applicator 142 may be weighted to provide a control effort to the first applicator 142 that is greater than the control effort exerted on the first applicator 142 by a second sensor 490 that is located further from the first applicator 142 than the first sensor 490.

Figure 4D:
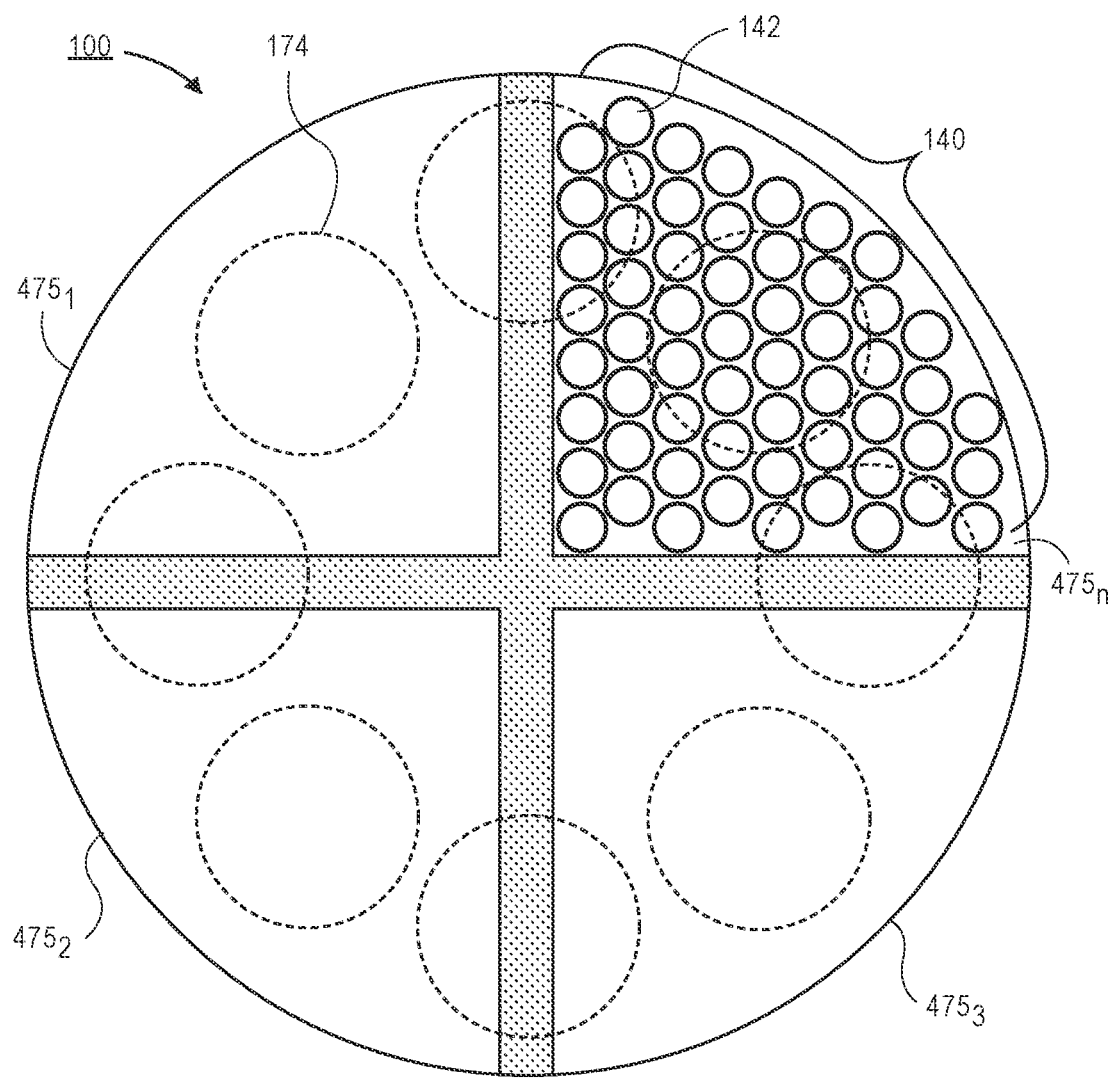
FIG. 4D is a plan view of an array of applicators that are formed in one zone of a multi-zone processing tool, in accordance with an embodiment.

Referring now to FIG. 4D, an additional plan-view illustration of an array 140 of applicators 142 positioned in a multi-zone processing tool 100 is shown, according to an embodiment. In an embodiment, the multi-zone processing tool 100 may include any number of zones. For example, the illustrated embodiment includes zones $475_1$-$475_n$. Each zone 475 may be configured to perform different processing operations on substrates 174 that are rotated through the different zones 475. As illustrated, a single array 140 is positioned in zone $475_n$. However, embodiments may include multi-zone processing tools 100 with an array 140 of applicators 142 in one or more of the different zones 475, depending on the needs of the device. The spatially tunable density of the plasma provided by embodiments allows for the accommodation of nonuniform radial velocity of the rotating substrates 174 as they pass through the different zones 475.

According to various embodiments, one or more microwave applicators may be coupled to local magnetic fields. As noted above, coupling the microwave applicators to local magnetic fields allows for the formation of stable plasmas even at low pressures. The magnetic field allows for the electron trajectory to be increased due to the Lorentz force. The longer trajectory increases the probability of ionizing collisions of an electron with the background gasses, and therefore, provides for a stable plasma at the lower pressure.

Embodiments include providing local magnetic fields with permanent magnets or electromagnets. The magnets may be formed proximate to each microwave applicator in some embodiments. In alternative embodiments, the magnets may be integrated within the housing of the microwave applicator. In some embodiments, the magnetic field strength of the magnets may be independently controllable, the field strength of the magnets may be controlled in groups, or the magnetic field strength of the magnets may be uniform.

Figure 5A:
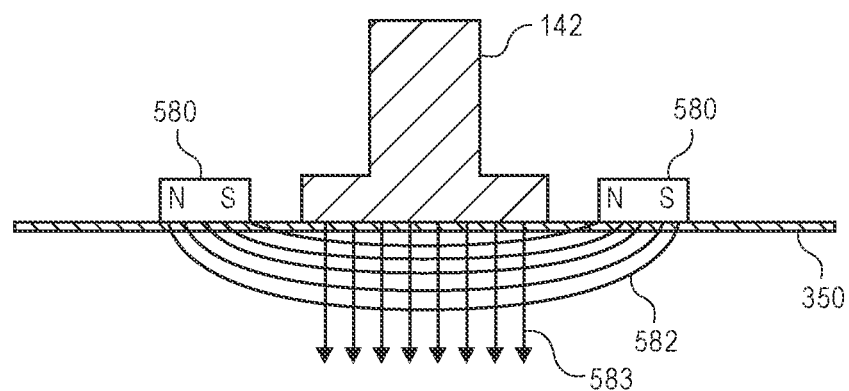
FIG. 5A is a cross-sectional illustration of an applicator and a permanent magnet placed over a dielectric plate, according to an embodiment.

Referring now to FIG. 5A, a cross-sectional illustration of an applicator 142 and permanent magnets 580 is shown, according to an embodiment. In the illustrated embodiment, the applicator 142 is shown schematically as a single component, but it is to be appreciated that the applicator 142 may be any applicator described herein. For example, the applicator 142 may include a dielectric cavity and a housing, such as the applicator 142 illustrated in FIG. 3A. In an embodiment, permanent magnets 580 may be arranged to form a ring around the perimeter of the applicator 142. In an embodiment, the permanent magnets 580 may have a magnetic field strength that is greater than approximately 10 G.

In an embodiment, the permanent magnets may have a magnetic field strength that is greater than approximately 500 G. Additional embodiments may have permanent magnets with a magnetic field strength that is greater than 800 G. In some embodiments, the magnetic field strength of the permanent magnets 580 may be chosen so that ECR is induced in a plasma. For example, when the plasma frequency is 2.45 GHz, the magnetic field strength may be 875 G. In an embodiment, the applicator 142 and the permanent magnets 580 may be placed on a dielectric plate 350 of a plasma processing chamber.

FIG. 5A also illustrates magnetic field lines 582 and the electric field lines 583. While the magnetic field lines 582 and the electric field lines 583 are shown as exemplary depictions and may not be true representations of the exact shape of either field, the relationship between the magnetic field lines 582 and the electric field lines 583 are generally true depictions. Particularly, the electric field lines 583 are relatively perpendicular to the magnetic field lines 582. This relationship is produced due to the magnets 580 being formed as a ring around the applicator 142. Due to the perpendicular relationship between the magnetic field lines 582 and the electric field lines 583, the Lorentz force is maximized.

In an embodiment, the use of local magnets 580 around the applicator 142 ensures that the magnetic field does not substantially extend towards a plane of a substrate (not shown) within the processing chamber. Instead, the magnetic field lines 582 remain local to where the plasma is formed proximate to the dielectric plate 350. Accordingly, even when large magnetic fields are present, the substrate will not be significantly exposed to potentially damaging magnetism. For example, the magnitude of the magnetic field present at the plane of the substrate may be less than 1 G.

Figure 5B:
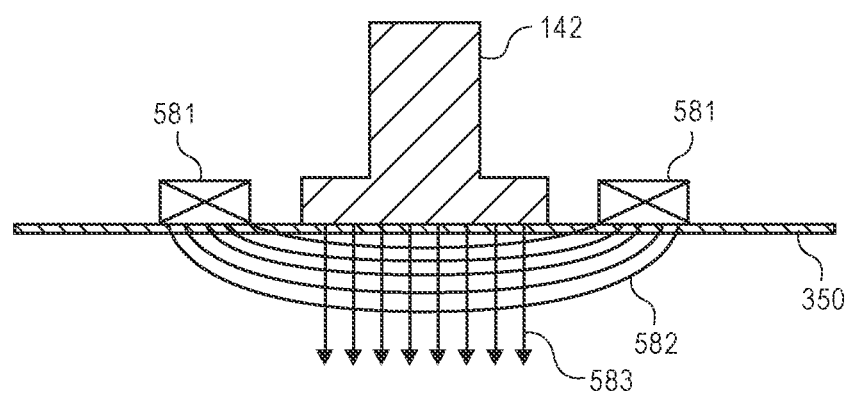
FIG. 5B is a cross-sectional illustration of an applicator and an electromagnet placed over a dielectric plate, according to an embodiment.

Referring now to FIG. 5B, a cross-sectional illustration of an applicator 142 and an electromagnet 581 is shown, according to an embodiment. Aside from replacing the permanent magnets with the electromagnet 581, the components in FIG. 5B are substantially similar to the components described in FIG. 5A. In an embodiment, the electromagnet 581 may be connected to a power source (not shown) in order to provide the desired magnetic field strength. Additionally, while a single ring is shown, it is to be appreciated that the electromagnet 581 may include any number of rings around the applicator 142. In an embodiment, the electromagnet 581 may have a magnetic field strength that is greater than approximately 10 G. In an embodiment, the electromagnet 581 may have a magnetic field strength that is greater than approximately 500 G. Additional embodiments may have an electromagnet 581 with a magnetic field strength that is greater than 800 G. In some embodiments, the magnetic field strength of the electromagnet 581 may be chosen so that ECR is induced in a plasma.

The use of an electromagnet 581 may be beneficial because the magnetic field is adjustable. For example, the magnetic field may be adjusted to tune the plasma. Embodiments may include altering the magnetic field of an electromagnet 581 in response to feedback information provided by one or more sensors, such as those described above. Additionally, the ability to tune the magnetic field allows for variations in the plasma to be produced in order to account for incoming substrate non-uniformities, provide improved tool-to-tool matching, and the like.

Figure 5C:
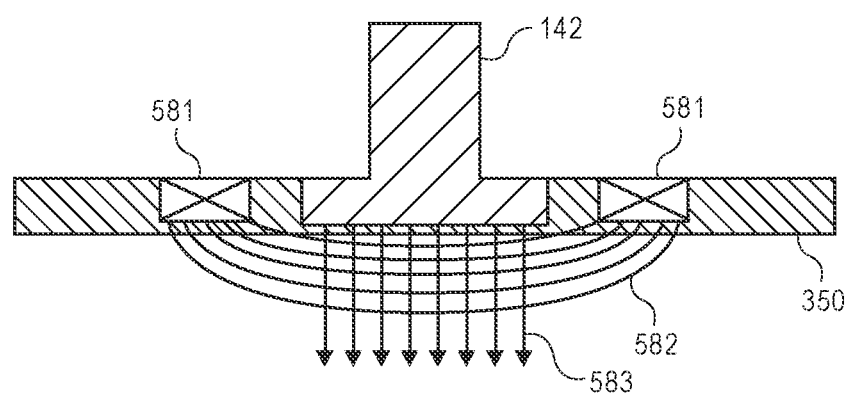
FIG. 5C is a cross-sectional illustration of an applicator and an electromagnet embedded in a dielectric plate, according to an embodiment.

Referring now to FIG. 5C, a cross-sectional illustration of an applicator 142 and an electromagnet 581 is shown, according to an additional embodiment. The components in FIG. 5C are substantially similar to the components in FIG. 5B, with the exception that the applicator 142 and the electromagnet 581 are embedded within the dielectric plate 350. In an embodiment, the electromagnet 581 may be embedded entirely within the dielectric plate 350, or the electromagnet may be placed in a grove in the dielectric plate 350 so that not all surfaces of the electromagnet are covered by the dielectric plate 350. While an electromagnet is illustrated in FIG. 5C, it is to be appreciated that a permanent magnet 581 may also be embedded or partially embedded within the dielectric plate 350 as well.

Figure 6A:
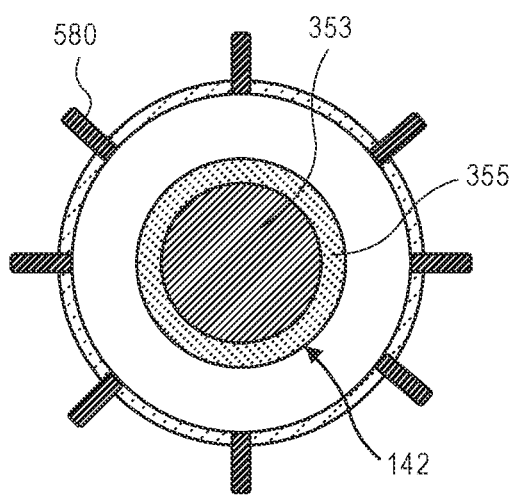
FIG. 6A is a plan view illustration of an applicator with a plurality of permanent magnets formed around the applicator, according to an embodiment.

Referring now to FIGS. 6A-6D, plan view illustrations of applicators and local magnets are shown, according to various embodiments. Referring now to FIG. 6A, a plurality of permanent magnets 580 formed in a ring around an applicator 142 is shown, according to an embodiment. As illustrated, the ring of permanent magnets 580 may be arrange around the housing 355 and dielectric resonant cavity 353 of the applicator 142. While eight permanent magnets 580 are shown, it is to be appreciated that any number of permanent magnets may be used. For example, a single permanent magnet 580 may be used or two or more permanent magnets 580 may be used.

Figure 6B:
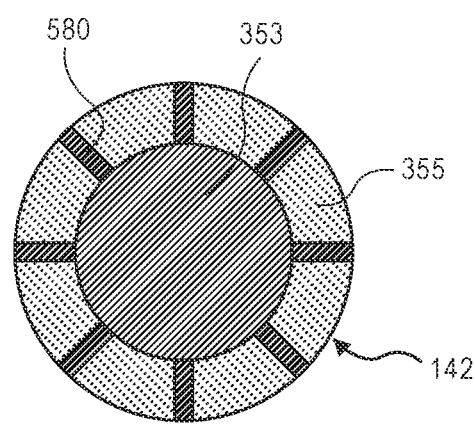
FIG. 6B is a plan view illustration of an applicator with a plurality of permanent magnets that are embedded within the housing of the applicator, according to an embodiment.

Referring now to FIG. 6B, a plan view illustration of an applicator 142 that includes integrated permanent magnets 580 is shown, according to an embodiment, In the illustrated embodiment, the permanent magnets 580 may be integrated within the housing 355 of the applicator 142 around the dielectric resonant cavity 353. Integrating the magnets within the housing 355 provides several advantages. One advantage is that combining the applicators 142 and the magnets 580 into a single component may allow for reduction on the overall footprint over the dielectric plate 350. Additionally, the benefits of coupling a magnetic source with the microwave source may be obtained without needing distinct components. As such, the assembly of the system and/or rearrangement of the system is less complex.

Figure 6C:
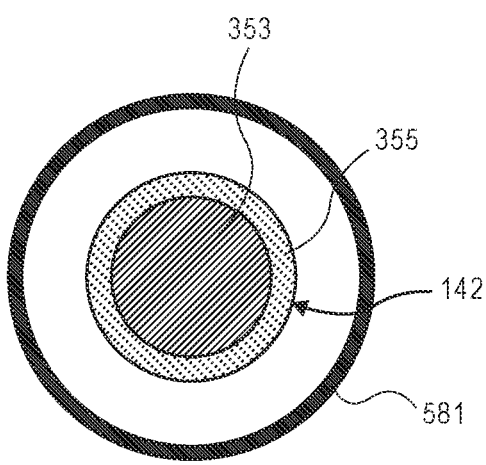
FIG. 6C is a plan view illustration of an applicator with an electromagnet formed around the applicator, according to an embodiment.

Referring now to FIG. 6C, a plan view illustration of an applicator 142 and an electromagnet 581 formed around the perimeter of the applicator housing 355 is shown, according to an embodiment. In the illustrated embodiment, the electromagnet 581 is shown as a substantially circular ring, but it is to be appreciated that the electromagnet 581 may be formed in any desired shape. While the electromagnet 581 is shown as a single ring around the applicator 142, it is to be appreciated that the electromagnet 581 may include more than one ring around the applicator 142. Additional embodiments may include an electromagnet 581 that does not completely encircle the applicator 142.

Figure 6D:
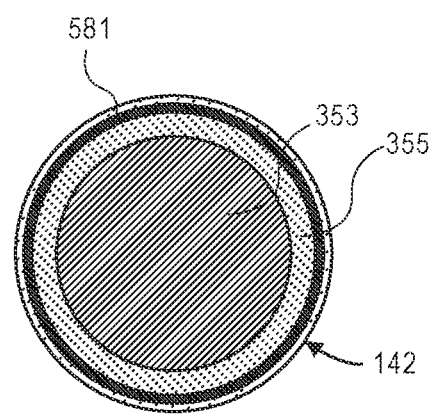
FIG. 6D is a plan view illustration of an applicator with an electromagnet embedded within the housing of the applicator, according to an embodiment.

Referring now to FIG. 6D, a plan view illustration of an applicator 142 and an electromagnet 581 integrated within the housing 355 of the applicator 142 is shown, according to an embodiment. While the electromagnet 581 is shown as a single ring around the applicator 142, it is to be appreciated that the electromagnet 581 may include more than one ring, or be a partial ring.

Figure 7A:
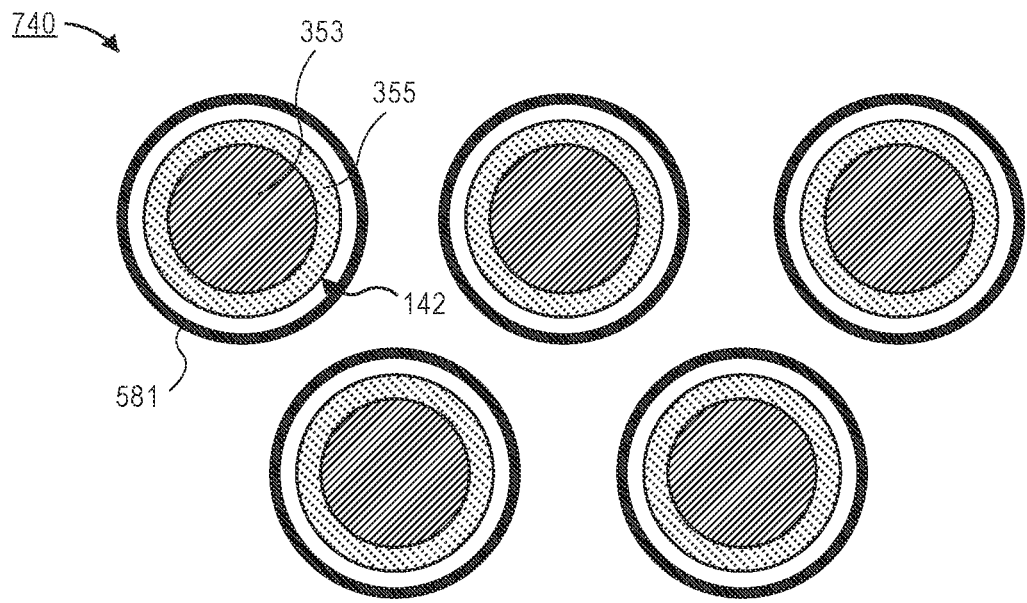
FIG. 7A is a plan view illustration of an array of applicators each surrounded by an electromagnetic ring, according to an embodiment.
Figure 7B:
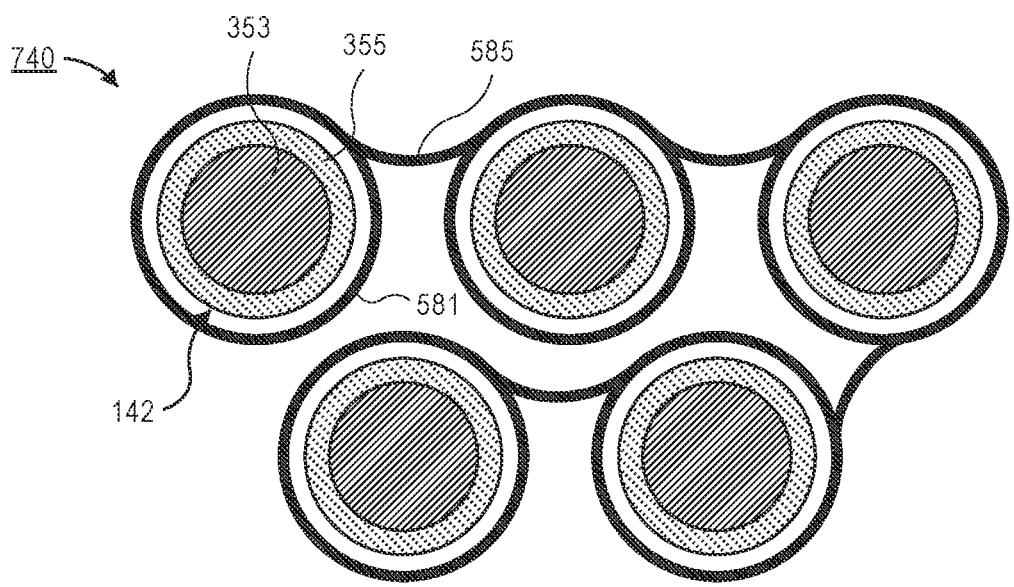
FIG. 7B is a plan view illustration of an array of applicators each surrounded by an electromagnetic ring that are connected in series, according to an embodiment.

In FIGS. 6A-6D, a single applicator with local magnet(s) surrounding or integrated within the applicator housing are illustrated. However, it is to be appreciated that embodiments including using an array of applicators and magnets in order to allow for greater flexibility in the shape of the plasma that will be formed. Arrays of such applicator and magnet combinations are shown in FIGS. 7A and 7B. Particularly, FIGS. 7A and 7B illustrate systems that utilize electromagnets, but it is to be appreciated that substantially similar arrangements may be used with permanent magnets as well.

Referring now to FIG. 7A, an array 740 of applicators 142 with a plurality of local electromagnets 581 is shown, according to an embodiment. In an embodiment, each applicator 142 is encircled by an electromagnet 581. In the illustrated embodiment, each applicator/electromagnet pair is substantially similar to the components illustrated in FIG. 6C. However, it is to be appreciated that a substantially similar array 740 may be formed with electromagnets 581 that are integrated into the housing of the applicator, similar to those illustrated in FIG. 6D. In an embodiment, the applicators 142 may be arranged in any desired pattern, and any number of applicators 142 may be used in the array 740. In some embodiments, each electromagnet 581 is independently controllable. Accordingly, the plasma may be tuned so that different portions of the plasma experience different magnetic field strengths. While not shown in FIG. 7A, it is to be appreciated that each of the electromagnets 581 may be electrically coupled to different power sources in order to provide the individual control of each electromagnet 581. In some embodiments, more than one electromagnet may be electrically coupled to a single power source in order to control groups of the electromagnets 581.

Referring now to FIG. 7B, a plan view illustration of an array 740 that includes electromagnets 581 that are electrically coupled to each other is shown, according to an embodiment. In such an embodiment, electrical connections 585 may connect individual electromagnets 581. In an embodiment, a plurality of electromagnets 581 may be connected in series with each other and/or in parallel with each other. In some embodiments, all electromagnets 581 are electrically coupled together. As such, a single power source may be used to provide the desired magnetic field strength to each electromagnet. In an additional embodiment, the array 740 may include two or more independently controllable groups of electromagnets 581, where each electromagnet 581 within a group are electrically coupled together by electrical connections 585. In such embodiments, each group of electromagnets 581 may be coupled to different power supplies.

Figure 8:
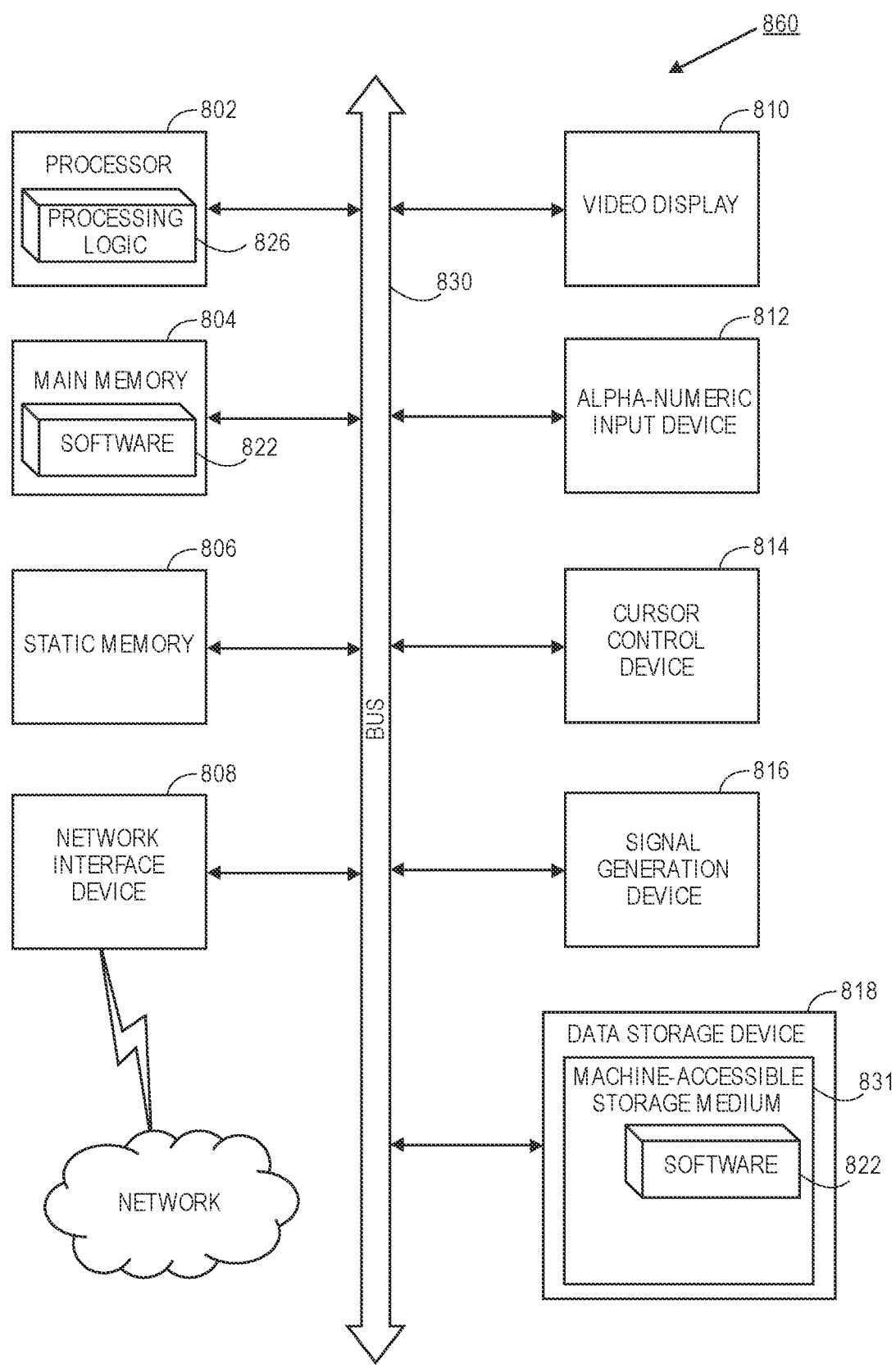
FIG. 8 illustrates a block diagram of an exemplary computer system that may be used in conjunction with a modular microwave radiation source, in accordance with an embodiment.

Referring now to FIG. 8, a block diagram of an exemplary computer system 860 of a processing tool 100 is illustrated in accordance with an embodiment. In an embodiment, computer system 860 is coupled to and controls processing in the processing tool 100. Computer system 860 may be connected (e.g., networked) to other machines in a Local Area Network (LAN), an intranet, an extranet, or the Internet. Computer system 860 may operate in the capacity of a server or a client machine in a client-server network environment, or as a peer machine in a peer-to-peer (or distributed) network environment. Computer system 860 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 860, the term "machine" shall also be taken to include any collection of machines (e.g., computers) that individually or jointly execute a set (or multiple sets) of instructions to perform any one or more of the methodologies described herein.

Computer system 860 may include a computer program product, or software 822, having a non-transitory machine-readable medium having stored thereon instructions, which may be used to program computer system 860 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 860 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic 826 for performing the operations described herein.

The computer system 860 may further include a system network interface device 808 for communicating with other devices or machines. The computer system 860 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 831 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 860, the main memory 804 and the system processor 802 also constituting machine-readable storage media. The software 822 may further be transmitted or received over a network 820 via the system network interface device 808.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A plasma processing tool, comprising:
   a processing chamber confining a processing volume; and
   a plurality of modular microwave sources coupled to the processing chamber, wherein the plurality of modular microwave sources comprise:
   an array of applicators positioned over a dielectric that forms a portion of an outer wall of the processing chamber, wherein each applicator of the array of applicators is in a first plane, and the dielectric is in a second plane, the second plane parallel with the first plane;
   an array of microwave amplification modules, wherein each microwave amplification module is coupled to one or more of the applicators in the array of applicators; and
   a plurality of magnets, wherein each of the plurality of magnets laterally surrounds a corresponding applicator of the array of applicators in the first plane, and wherein the plurality of magnets are electrically coupled to each other in series in the first plane.

2. The plasma processing tool of claim 1, wherein the plurality of magnets are electromagnets.

3. The plasma processing tool of claim 2, wherein each electromagnet is formed around one the applicators.

4. The plasma processing tool of claim 3, wherein each electromagnet is formed around more than one applicator.

5. The plasma processing tool of claim 1, wherein one or more of the plurality of magnets is integrated within a housing of at least one of the applicators.

6. The plasma processing tool of claim 1, wherein one or more of the plurality of magnets is embedded within the dielectric plate.

7. The plasma processing tool of claim 1, wherein a magnetic field strength of the magnets is greater than 10 G.

8. The plasma processing tool of claim 1, wherein a magnetic field strength of the magnets is chosen so that a plasma generated by the processing tool experiences electron cyclotron resonance (ECR).

9. The plasma processing tool of claim 1, further comprising a plurality of plasma sensors positioned among the applicators.

10. The plasma processing tool of claim 9, wherein feedback control data for each microwave amplification module is provided by one or more of the plurality of plasma sensors.

* * * * *